United States Patent

Mesley

[15] 3,642,476

[45] Feb. 15, 1972

[54] METHOD OF PREPARING GLASS MASTERS

[72] Inventor: Nimrod N. Mesley, Endwell, N.Y.

[73] Assignee: International Business Machines Corporation, Armonk, N.Y.

[22] Filed: May 21, 1970

[21] Appl. No.: 39,412

[52] U.S. Cl. ..................... 96/38, 96/38.3, 117/124, 117/160, 117/47, 156/24

[51] Int. Cl. ..................... G03c 5/00, G03c 11/00

[58] Field of Search ..................... 96/36, 38.3; 117/124 C, 160 R, 117/47 A, 124 B, 47 R

[56] References Cited

UNITED STATES PATENTS

| | | | |
|---|---|---|---|
| 2,399,799 | 5/1946 | Guellich | 96/38.3 |
| 2,533,454 | 12/1950 | Gresham | 96/38.1 |
| 2,917,403 | 12/1959 | Sugarman | 117/124 B X |
| 3,011,920 | 12/1961 | Shipley | 117/160 R X |
| 3,222,173 | 12/1965 | Belko et al. | 96/36.2 |
| 3,443,915 | 5/1969 | Wood et al. | 117/124 C X |
| 3,573,973 | 4/1971 | Drotar et al. | 96/36.2 X |

*Primary Examiner*—David Klein
*Attorney*—Hanifin and Jancin and Hansel L. McGee

[57] ABSTRACT

A method of preparing glass masters for use in the mass production of printed circuitry is provided. A transparent glass substrate is coated with a polyvinyl alcohol-catalytic agent complex, dried and immersed into an electroless metal bath. The metal coated substrate is coated with a conventional photoresist, exposed to actinic radiation, developed and the exposed metal is subsequently etched to provide a desired metal pattern. The deposited metal adheres very strongly to the substrate without the prior mechanical or chemical roughening thereof.

8 Claims, 4 Drawing Figures

Figure 1:
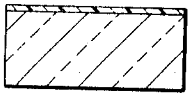
Figure 2:
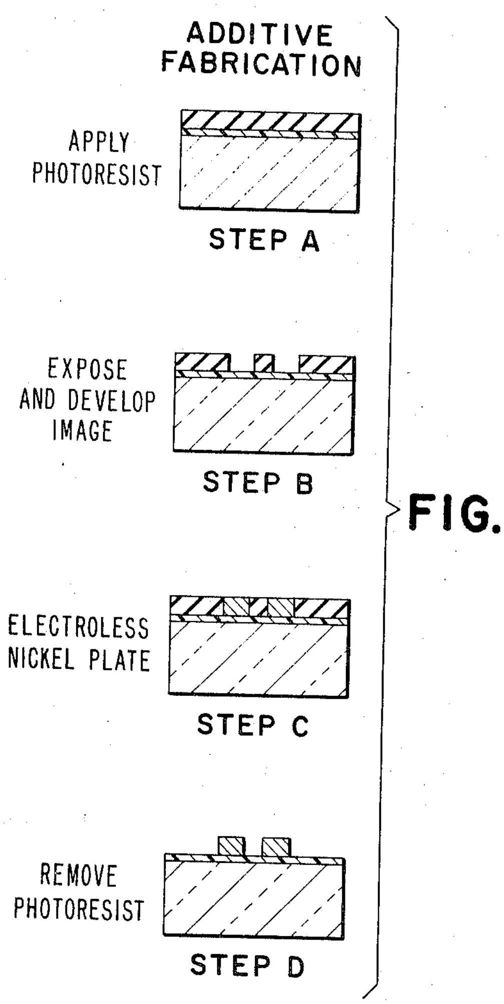
Figure 3:
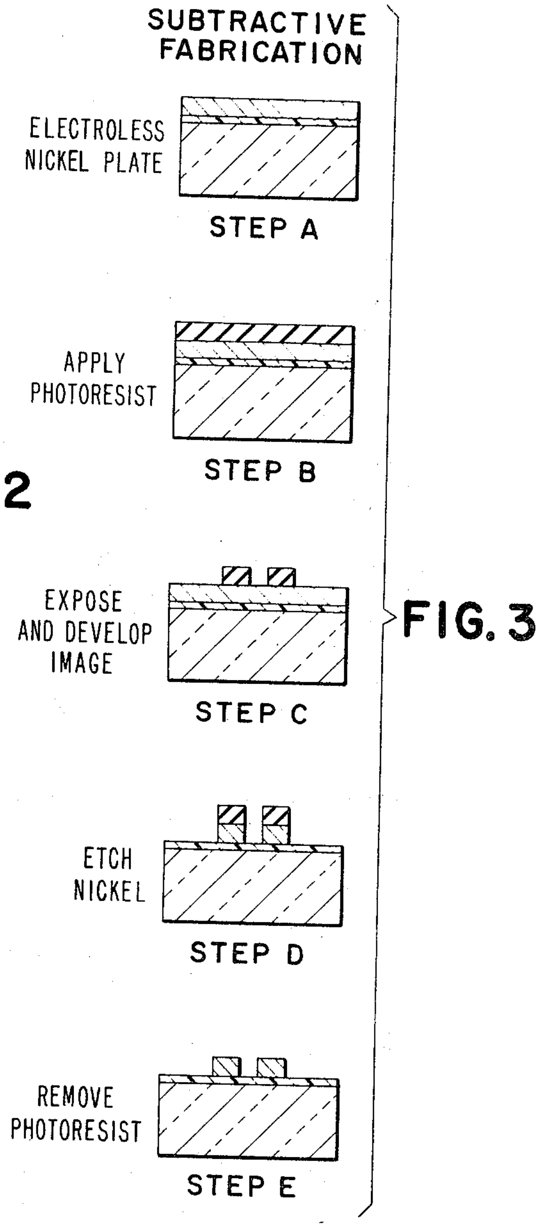
Figure 4:
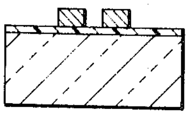

INVENTOR
NIMROD N. MESLEY

BY

ATTORNEY

METHOD OF PREPARING GLASS MASTERS

BACKGROUND OF THE INVENTION

1. Field of the Invention

The present invention relates to a method of preparing glass masters for use in the production of printed circuitry; more particularly the invention relates to a method of preparing glass masters in which the step of sensitizing a substrate with a polyvinyl alcohol/$PdCl_2$ complex is incorporated.

A glass master comprises a transparent glass substrate having disposed thereon a photographic image of a desired circuit pattern. In the mass production of printed circuitry it is used as a mask image for the subsequent production of printed circuits. For example, the master is disposed on the surface of a photoresist material which in turn is disposed on the surface of a metal film. The photoresist is exposed to actinic radiation through the glass master, the exposed areas of the photoresist are removed and the underlying metal is etched to effect a replica of the image disposed on the glass master. It is important that the resulting glass master be transparent to light in the wave lengths of 500 to 200 mu, have substantially no light scattering, and that there be a strong bond between the metal and substrate, that is, the metal should not be easily peeled from the substrate.

2. Description of the Prior Art

In the prior art, glass masters have been prepared by coating the transparent glass substrate with a photosensitive silver emulsion. A circuit pattern is exposed on the emulsion which is then processed by the conventional silver emulsion process to yield a photographic circuit pattern. Other prior art methods comprise the evaporation or sputtering of a metal onto the glass surface. In addition, other prior art methods electrolessly deposit the metal onto a substrate which has the catalyst absorbed on the surface. These methods are expensive. The method where surface absorption of the catalyst is required, also has the shortcoming of not being able to provide metal films which adhere well to the glass surface without prior mechanical or chemical roughening of the substrate. Further, the roughening of the surface causes severe scattering of light so that when the glass master is used to produce printed circuitry, poor image resolution is obtained.

The prior art describes several other methods to effect the metallization of a plastic substrate. For example, in copending application Ser. No. 605,639 by John V. Powers, et al., "-Metallization of Plastic Materials," filed on Dec. 29, 1966, now U.S. Pat. No. 3,523,824, issued Aug. 11, 1970 and assigned to the assignee hereof, there is presented such a method in which a plastic substrate is coated with a compatible solvent containing a catalyst. The coating is dried and is reduced so as to catalyze a metal plating operation. Similarly, in U.S. Pat. No. 3,347,724, there is taught a method of metal plating by first treating a porous substrate surface with a catalytic ink composition. The ink impregnates the surface and is subsequently reduced thermally or chemically prior to metallization. While the above methods have been found suitable for the particular substrates used, they have not been found suitable for the metallization of glass in the preparation of glass masters. The materials used in the above prior art when used in the preparation of glass masters, hinder the transmission of light having wavelengths of from 500–200 mu and cause severe light scattering. They do not provide a strong adhering surface for the plated metal, i.e., the metal is readily peeled from the glass surface.

SUMMARY OF THE INVENTION

Glass masters are prepared by coating a glass substrate with a catalytic polymer complex which is used to catalyze an electroless metal plating. The catalytic polymer complex comprises a aqueous solution of polyvinyl alcohol in which a water soluble catalyst receptive to electroless plating is dissolved. The coated substrate is immersed in an electroless metal plating solution from which a metal is deposited on the coated material. The metal plated substrate is then coated with a photoresist material disposed in a predetermined pattern to actinic radiation and developed. The exposed metal is then etched in the predetermined pattern.

The uniqueness of the present invention is the use of a catalyst-polyvinyl alcohol complex. The complex provides a homogenous coating. In the prior art, dispersed suspensions are used and their ability to catalyze electroless plating is dependent on the dispersed catalyst being at the surface and not covered or encapsulated by the resin. In the present invention, the catalytic polymer complex coating serves as the catalyst. The coating provided is transparent and will not destroy any desired color effects of the base material whereas in the prior art, where dispersed suspensions are used, the coatings diffuse light and in many cases change the total color of the coated substrate because of the coating itself being colored.

OBJECT OF THE INVENTION

It is therefore an object of the invention to provide an improved method for the preparation of glass masters to be used in the mass production of printed circuitry wherein the novel step of coating a glass substrate with a polyvinyl alcohol catalyst complex, to electrolessly deposit a metal on said glass substrate.

The FIGS. 1–4 depict a series of steps in the preparation of glass masters by subtractive or additive methods.

PREFERRED EMBODIMENT OF THE INVENTION

In the preparation of the glass masters, a catalytic coating solution is prepared by dissolving from about 5 grams to about 100 grams of polyvinyl alcohol and from about 0.5 to 100 grams of a water soluble catalyst, such as, palladium chloride in 1 liter of water. A preferred catalytic polymer complex formulation is as follows:

Fifteen grams of Elvanol 52–22, a polyvinyl alcohol, prepared by E. I. DuPont De Nemours & Company, is dissolved in 1 liter of water to which is added 0.5 grams of palladium chloride.

The above coating composition is whirl coated onto the surface of a micro-flat glass substrate at 300 r.p.m. for about 2 minutes or until the coated material is dry. Alternately, the coating can be oven-dried at 200°–400° F. for 30 minutes. The resultant film is approximately 200 A. thick and has a transmission of about 90–100 percent of light having wavelengths in the range of 500 millimicrons to 200 millimicrons. The coated substrate shown in FIG. 1 can then be photofabricated by either the additive or subtractive fabrication techniques. In FIG. 2*a* through 2*d*, there is shown the additive method of fabrication wherein a conventional photoresist material such as, Shipley's AZ–1350 photoresist is whirl coated over the catalytic coating at 300 r.p.m. for 2 minutes and then oven dried at 190° F. for 15 minutes. The photoresist coating is then exposed in a predetermined pattern to actinic radiation and is developed leaving exposed areas revealing the catalytic surface. The substrate is then immersed in an electroless metal plating bath where deposition of a metal occurs on the exposed catalytic surface. For the purposes of this invention, the following electroless plating solution formulations shown in the following examples, are used:

EXAMPLE I (NICKEL)

| | |
|---|---|
| Nickel sulfate | 20 g./l. |
| Sodium hypophosphite | 30 g./l. |
| Hydroxyacetic acid | 28 g./l. |
| pH (adjust w/ammonia) | 4.5–5.0 |
| Temperature | 150° F. |

EXAMPLE II (NICKEL)

| | |
|---|---|
| Nickel sulfate | 20 g./l. |

| | |
|---|---|
| Lactic acid | 27 g./l. |
| Propionic acid | 2 g./l. |
| Sodium hypophosphite | 24 g./l. |
| pH | 4.5–4.7 |
| Temperature | 190° F. |

EXAMPLE III (COPPER)

| | |
|---|---|
| Copper nitrate | 15 g./l. |
| Sodium bicarbonate | 10 g./l. |
| Sodium hydroxide | 20 g./l. |
| Rochelle salt | 30 g./l. |
| Formaldehyde | 100 ml./l. |
| Temperature | 75° F. |

EXAMPLE IV (COBALT)

| | |
|---|---|
| Cobalt chloride | 30 g./l. |
| Sodium citrate | 35 g./l. |
| Ammonium chloride | 50 g./l. |
| Sodium hypophosphite | 20 g./l. |
| pH | 9–10 |
| Temperature | 190° F. |

EXAMPLE V (NICKEL-COBALT)

| | |
|---|---|
| Cobalt chloride | 30 g./l. |
| Nickel chloride | 30 g./l. |
| Rochelle salt | 200 g./l. |
| Ammonium chloride | 50 g./l. |
| Sodium hypophosphite | 20 g./l. |
| pH | 8–10 |
| Temperature | 190° F. |

The substrate is allowed to remain in one of the above electroless metal solutions for about 2 minutes to give a lustrous nickel or copper deposit having a thickness of about 10 to about 20 microinches and an optical density greater than 4.0. The remaining photoresist is removed by conventional methods to provide a metallized glass master, shown in FIG. 4. The metal image is virtually opaque to light while the remaining areas having the catalytic polymer complex coated thereon are substantially transparent to light.

Alternately, the glass master may be fabricated by the substractive method shown in FIGS. 3*a*–3*e*. The polymer complex coated substrate of FIG. 1 is immersed for example, in one of the electroless nickel plate solutions described above. To the electroless nickel plate substrate of FIG. 3*a* there is applied a conventional photoresist such as that mentioned above and treated similarly. The photoresist is exposed and an image developed. The nickel surface is etched with an etchant comprised of about 20 percent nitric acid and about 80 percent phosphoric acid. The photoresist is then removed to provide the nickel plated glass master of FIG. 4, having the same properties as mentioned above. For the purposes of comparison, catalytic inks disclosed in Examples 1–10 of U.S. Pat. No. 3,347,724 were used in the manner disclosed therein. For example, the catalytic ink shown in Example I containing 50 grams of Xylene, 75 grams of Diacetone alcohol, 50 grams of Parlon 10 c.p.s., 10 grams of Phenol-formaldehyde (oil soluble), 20 grams of Butadiene-acrylonitrile rubber, 3 grams of Cab-O-Sil and 70 grams of Cuprous oxide was disposed on a glass substrate. The coated substrate was immersed in a nickel plating bath of the present invention. The bath was heated to a temperature of 150° F. After 6 hours the coated substrate still had not plated. Likewise, an identical coated substrate was immersed in an electroless copper plating bath of U.S. Pat. No. 3,347,724. After 2 hours of immersion, the coated substrate still had not plated. In addition, the catalytic coating had started to lift or peel from the glass surface showing little or no adherence to the substrate. In the present invention, after 1 minute of plating, good adherent metal films were obtained which passed the conventional hash mark-tape test for adhesion.

Further, the printing ink formulation of U.S. Pat. No. 3,447,724 was opaque to light and provided severe scattering. It is, therefore, apparent that the catalytic inks of the above-mentioned patent are unsuitable for the purposes of the present invention.

Thus, there has been provided an improved method of making glass masters in which there is included the steps of coating a substrate with a catalytic polymer complex consisting of an aqueous solution of polyvinyl alcohol and a water soluble catalytic agent such as $PdCl_2$. The glass masters prepared by the above method have the feature of being substantially transparent to light with substantially no light scattering and are capable of providing close image tolerance, that is, having an image edge gradient of 50 microinches or less. Additionally, deposited metal adheres strongly to the substrate.

It should be noted that while the invention has been described using $PdCl_2$ as the catalytic agent, other water soluble catalytic agents, such as, water soluble salts of gold, silver or the platinum group metals, which are receptive to electroless metal and which form a complex with polyvinyl alcohol can also be used. Similarly, electroless metal baths other than those containing nickel can also be used; for example, a copper containing bath will operate just as efficiently.

It should be apparent that while the invention has been described relative to the preparation of glass masters, it is also suitable for the preparation of printed circuitry generally. One may readily substitute other insulative substrates for the glass substrate of the present invention. For example, similar results are obtainable where polyamide, epoxy resins or other plastic substrates are used.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An improved method of preparing glass masters for use in the production of printed circuitry comprising the steps of:
   a. coating the surface of a micro-flat transparent glass substrate with a solution consisting of a polyvinyl alcohol-catalytic agent complex receptive to electroless metal;
   b. immersing said coated glass substrate into an electroless metal depositing bath for a time sufficient to deposit a strongly adhering metal film thereon,
   c. applying a photoresist material onto the surface of said metal film;
   d. exposing said photoresist material to actinic radiation in a predetermined pattern and thereafter developing said exposed photoresist coating;
   e. etching said exposed metal film; and
   f. removing said photoresist to provide an improved glass master.

2. The method of claim 1 wherein said catalytic agent is $PdCl_2$.

3. The method of claim 1 wherein said solution of polyvinyl alcohol-catalytic agent complex consists of about 5 grams to about 100 grams of polyvinyl alcohol and from about 0.5 to about 100 grams of $PdCl_2$ in 1 liter of water.

4. The method of claim 1 wherein said polyvinyl alcohol-catalytic agent complex is a solution consisting of about 15 grams of polyvinyl alcohol and 0.5 grams of $PdCl_2$ in 1 liter of water.

5. An improved method of preparing glass masters for use in the production of printed circuitry comprising the steps of:
   a. coating the surface of a micro-flat transparent glass substrate with a solution consisting of a polyvinyl alcohol-catalytic agent complex receptive to electroless metal;
   b. applying a photoresist material on the surface of said coated glass substrate;

c. exposing said photoresist material to actinic radiation in a predetermined pattern and thereafter developing said exposed photoresist material;

d. immersing said substrate into an electroless metal depositing bath for a sufficient time to deposit a metal in the photoresist-free areas; and thereafter e. removing said photoresist material to provide an improved glass master.

6. The method of claim 5 wherein said catalytic agent is $PdCl_2$.

7. The method of claim 5 wherein said solution of polyvinyl alcohol-catalytic agent complex consists of about 5 grams to about 100 grams of polyvinyl alcohol and from about 0.5 grams to about 100 grams of $PdCl_2$ in 1 liter of water.

8. The method of claim 5 wherein said solution of polyvinyl alcohol-catalytic agent complex consists of about 15 grams of polyvinyl alcohol and about 0.5 grams of $PdCl_2$ in 1 liter of water.

* * * * *